(12) United States Patent
Liu et al.

(10) Patent No.: US 11,804,408 B2
(45) Date of Patent: Oct. 31, 2023

(54) SEMICONDUCTOR DEVICE AND METHOD

(71) Applicant: Taiwan Semiconductor Manufacturing Co., Ltd., Hsinchu (TW)

(72) Inventors: Wei-Min Liu, Hsinchu (TW); Hsueh-Chang Sung, Zhubei (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/826,563

(22) Filed: May 27, 2022

(65) Prior Publication Data

US 2022/0293473 A1    Sep. 15, 2022

Related U.S. Application Data

(63) Continuation of application No. 16/889,397, filed on Jun. 1, 2020, now Pat. No. 11,348,840.
(Continued)

(51) Int. Cl.
*H01L 21/8238* (2006.01)
*H01L 27/092* (2006.01)
(Continued)

(52) U.S. Cl.
CPC ........... *H01L 21/823814* (2013.01); *H01L 21/823821* (2013.01); *H01L 21/823842* (2013.01);
(Continued)

(58) Field of Classification Search
CPC ..... H01L 21/823814; H01L 21/823821; H01L 21/823842; H01L 21/823864;
(Continued)

(56) References Cited

U.S. PATENT DOCUMENTS 10,141,420 B1   11/2018   Cheng et al.
10,170,555 B1   1/2019    Liao et al.
(Continued)

FOREIGN PATENT DOCUMENTS

KR   20160125208 A   10/2016
KR   20170121667 A   11/2017
KR   20190003298 A   1/2019

*Primary Examiner* — Karen Kusumakar
*Assistant Examiner* — Adam S Bowen
(74) *Attorney, Agent, or Firm* — Slater Matsil, LLP

(57) ABSTRACT

A method includes forming a gate structure over fins protruding from a semiconductor substrate; forming an isolation region surrounding the fins; depositing a spacer layer over the gate structure and over the fins, wherein the spacer layer fills the regions extending between pairs of adjacent fins; performing a first etch on the spacer layer, wherein after performing the first etch, first remaining portions of the spacer layer that are within inner regions extending between pairs of adjacent fins have a first thickness and second remaining portions of the spacer layer that are not within the inner regions have a second thickness less than the first thickness; and forming an epitaxial source/drain region adjacent the gate structure and extending over the fins, wherein portions of the epitaxial source/drain region within the inner regions are separated from the first remaining portions of the spacer layer.

20 Claims, 23 Drawing Sheets

Related U.S. Application Data

(60) Provisional application No. 62/927,864, filed on Oct. 30, 2019.

(51) Int. Cl.
*H01L 29/04* (2006.01)
*H01L 29/06* (2006.01)
*H01L 29/08* (2006.01)
*H01L 29/66* (2006.01)
*H01L 29/78* (2006.01)

(52) U.S. Cl.
CPC ........... *H01L 21/823864* (2013.01); *H01L 21/823871* (2013.01); *H01L 21/823878* (2013.01); *H01L 27/0924* (2013.01); *H01L 29/045* (2013.01); *H01L 29/0653* (2013.01); *H01L 29/0847* (2013.01); *H01L 29/6653* (2013.01); *H01L 29/66545* (2013.01); *H01L 29/66636* (2013.01); *H01L 29/7848* (2013.01)

(58) Field of Classification Search
CPC ..... H01L 21/823871; H01L 21/823878; H01L 27/0924; H01L 29/045; H01L 29/0653; H01L 29/0847; H01L 29/6653; H01L 29/66545; H01L 29/66636; H01L 29/7848; H01L 21/823857; H01L 29/6656; H01L 29/165; H01L 21/28141; H01L 29/66795; H01L 29/785
See application file for complete search history.

(56) References Cited

U.S. PATENT DOCUMENTS

| | | | |
|---|---|---|---|
| 2014/0183605 A1* | 7/2014 | Mochizuki | H01L 29/66795 257/288 |
| 2016/0315081 A1 | 10/2016 | Park et al. | |
| 2016/0365414 A1 | 12/2016 | Peng et al. | |
| 2017/0062601 A1 | 3/2017 | Basker et al. | |
| 2017/0309624 A1 | 10/2017 | Cheng et al. | |
| 2018/0151439 A1* | 5/2018 | Huang | H01L 29/66545 |
| 2018/0175172 A1 | 6/2018 | Chang et al. | |
| 2019/0148528 A1 | 5/2019 | Yu et al. | |

\* cited by examiner

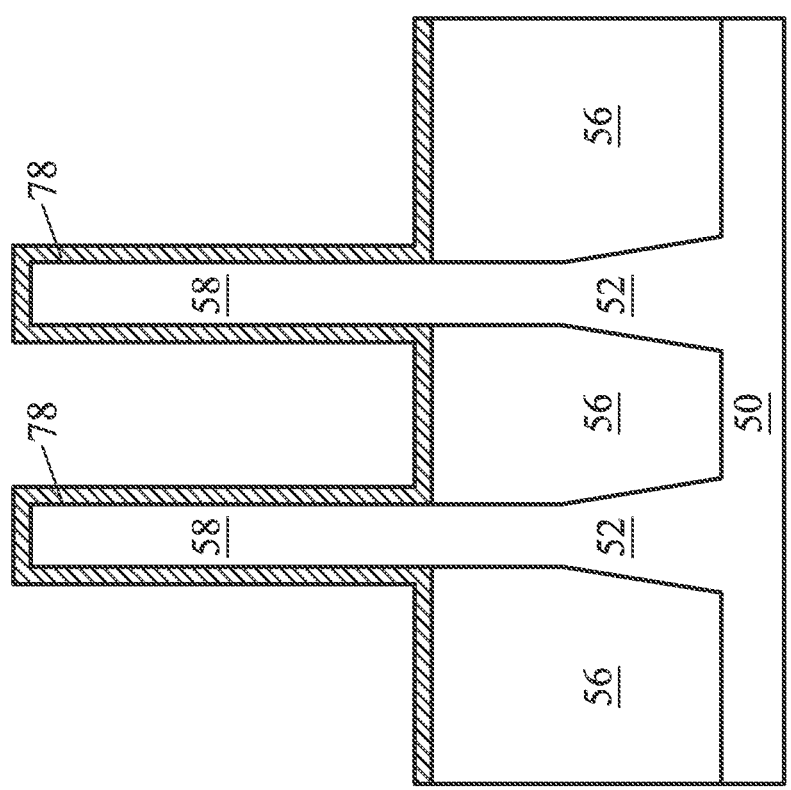

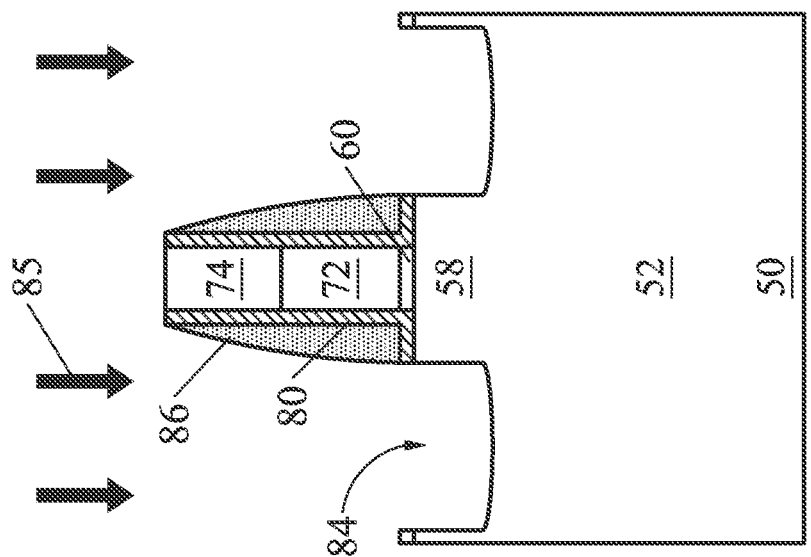
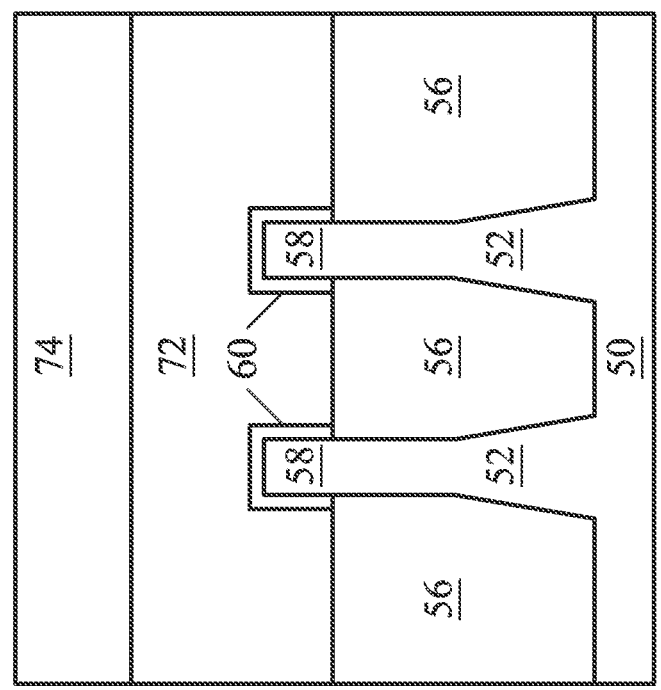
Figure 10B
Figure 10A

SEMICONDUCTOR DEVICE AND METHOD

This application is a continuation of U.S. patent application Ser. No. 16/889,397, filed on Jun. 1, 2020, now U.S. Pat. No. 11,348,840, issued May 31, 2022, entitled "Semiconductor Device and Method," which claims the benefit of U.S. Provisional Application No. 62/927,864, filed on Oct. 30, 2019, entitled "Higher Inner Initial Growth Height Epitaxial Source Drain," each application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 8C, 9A, 9B, 9C, 10A, 10B, 10C, 11A, 11B, 11C, 12, 13A, 13B, 14A, 14B, 15A, 15B, 16A, 16B, 16C, 17A, 17B, 18A, and 18B are cross-sectional views of intermediate stages in the manufacturing of FinFETs, in accordance with some embodiments.

DETAILED DESCRIPTION

Figure 1:
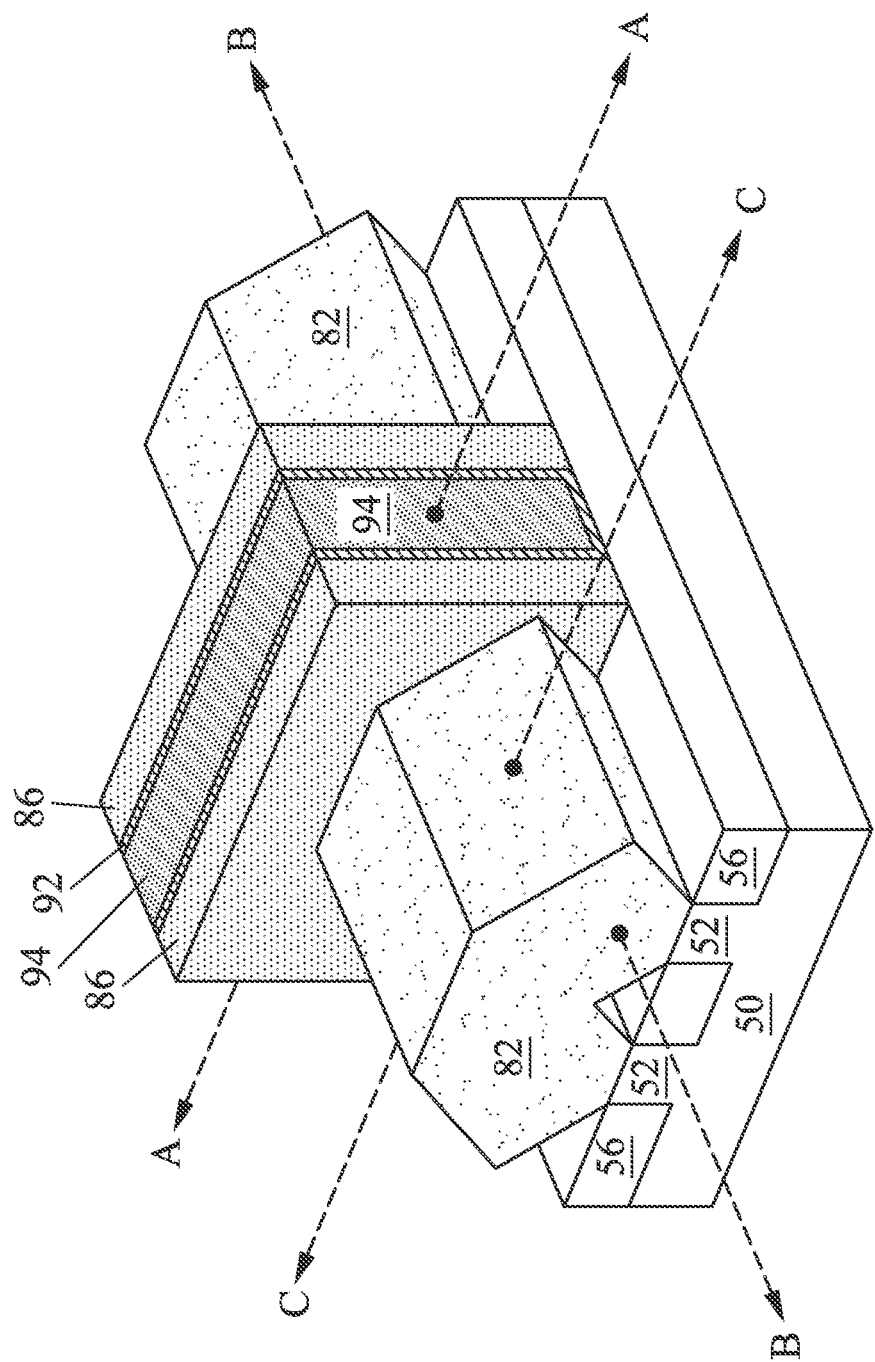
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming source/drain regions having reduced volume and reduced cross-sectional area. The source/drain regions may be formed by depositing a spacer material over fins and filling regions between adjacent fins with the spacer material. An etching process is performed to etch the spacer material such that remaining portions of the spacer material between the adjacent fins are higher than remaining portions of the spacer material outside of the adjacent fins. This can cause the epitaxial source/drain regions to grow laterally between the fins from a lowest point that is higher than the lowest point of lateral growth on the outer sidewalls of the fins. Using the techniques described herein, adjacent source/drain regions may be formed that merge at a higher distance above the substrate, which reduces the cross-sectional area of the merged source/drain region. Semiconductor devices manufactured according to embodiments of the present application and including the source/drain regions may experience reduced gate-to-drain capacitance (Cgd), reduced RC delay, faster on/off switching, and boosted device speed.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 18B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 13A, 14A, 15A, 16A, 17A, and 18A are illustrated along reference cross-section A-A illustrated in FIG. 1. FIGS. 8B, 9B, 10B, 11B, 13B, 14B, 15B, 16B, 16C, 17B, and 18B are illustrated along a similar cross-section B-B illustrated in FIG. 1. FIGS. 8C, 9C, 10C, 11C, and 12 are illustrated along reference cross-section C-C illustrated in FIG. 1.

Figure 2:
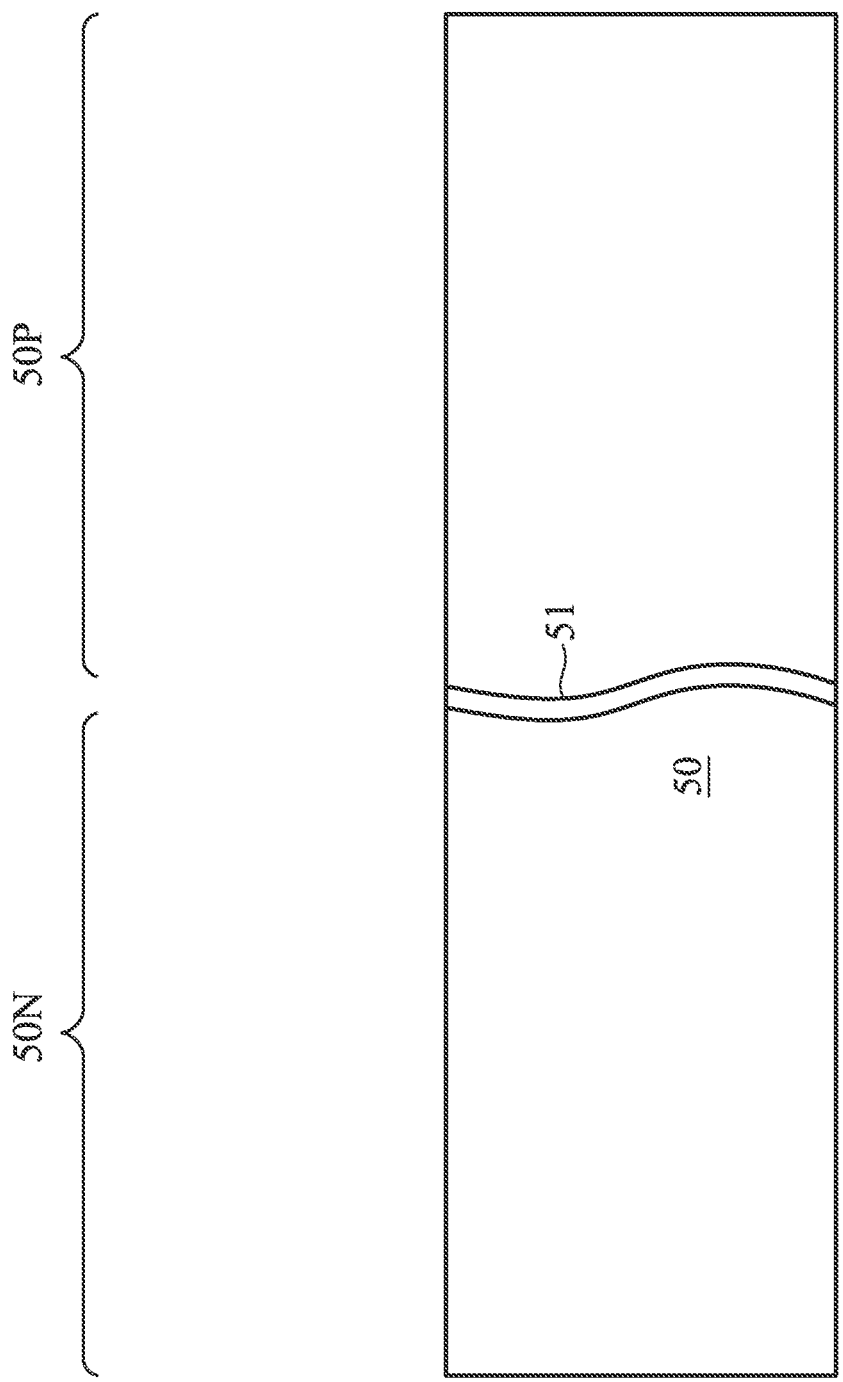

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
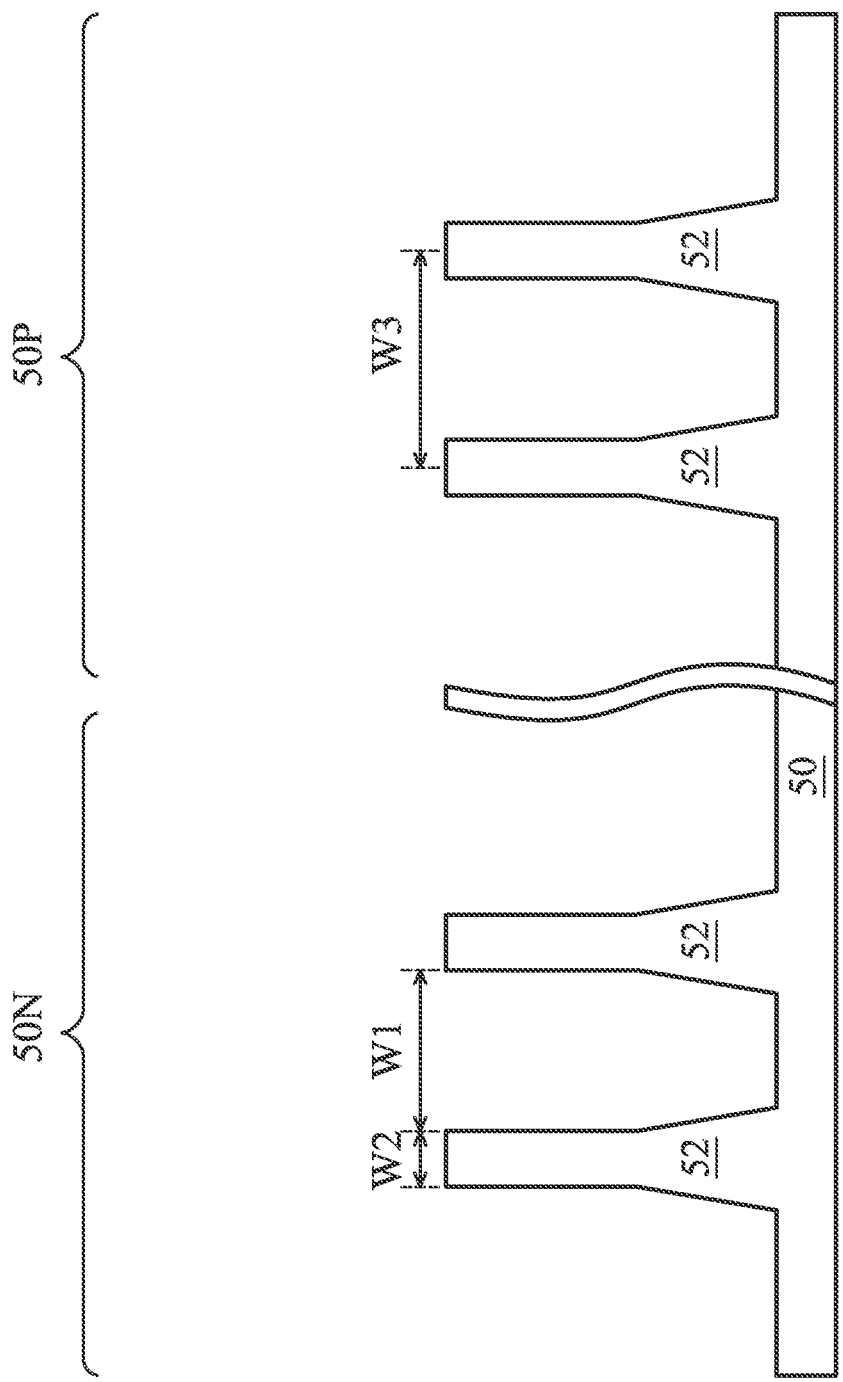

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. In some embodiments, the fins 52 may be formed such that adjacent fins 52 are separated by a distance W1 that is between about 10 nm and about 40 nm. In some embodiments, the fins 52 may be formed having a width W2 that is between about 5 nm and about 30 nm. In some embodiments, the fins 52 may be formed having a pitch W3 that is between about 15 nm and about 50 nm.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
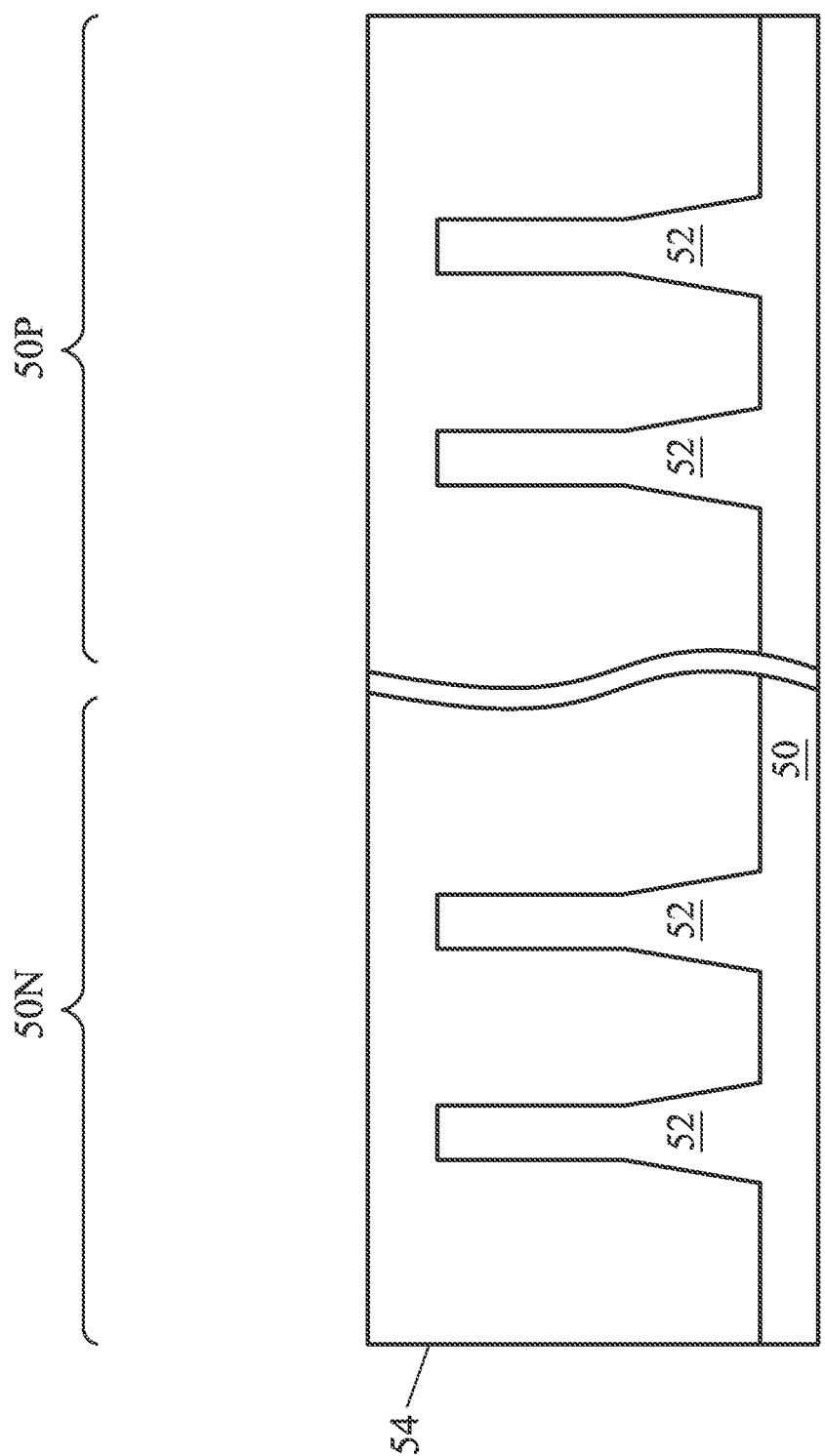

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
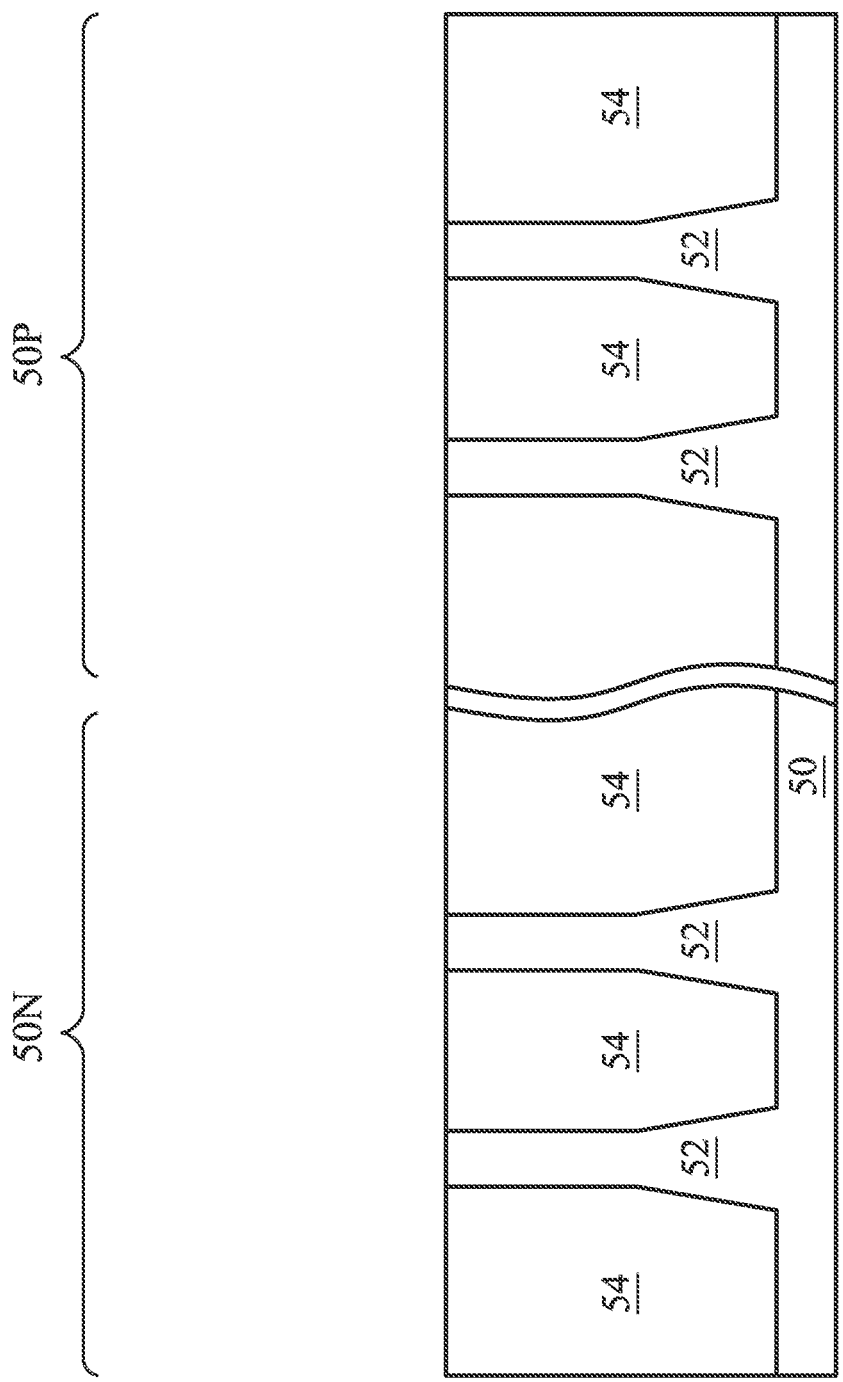

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
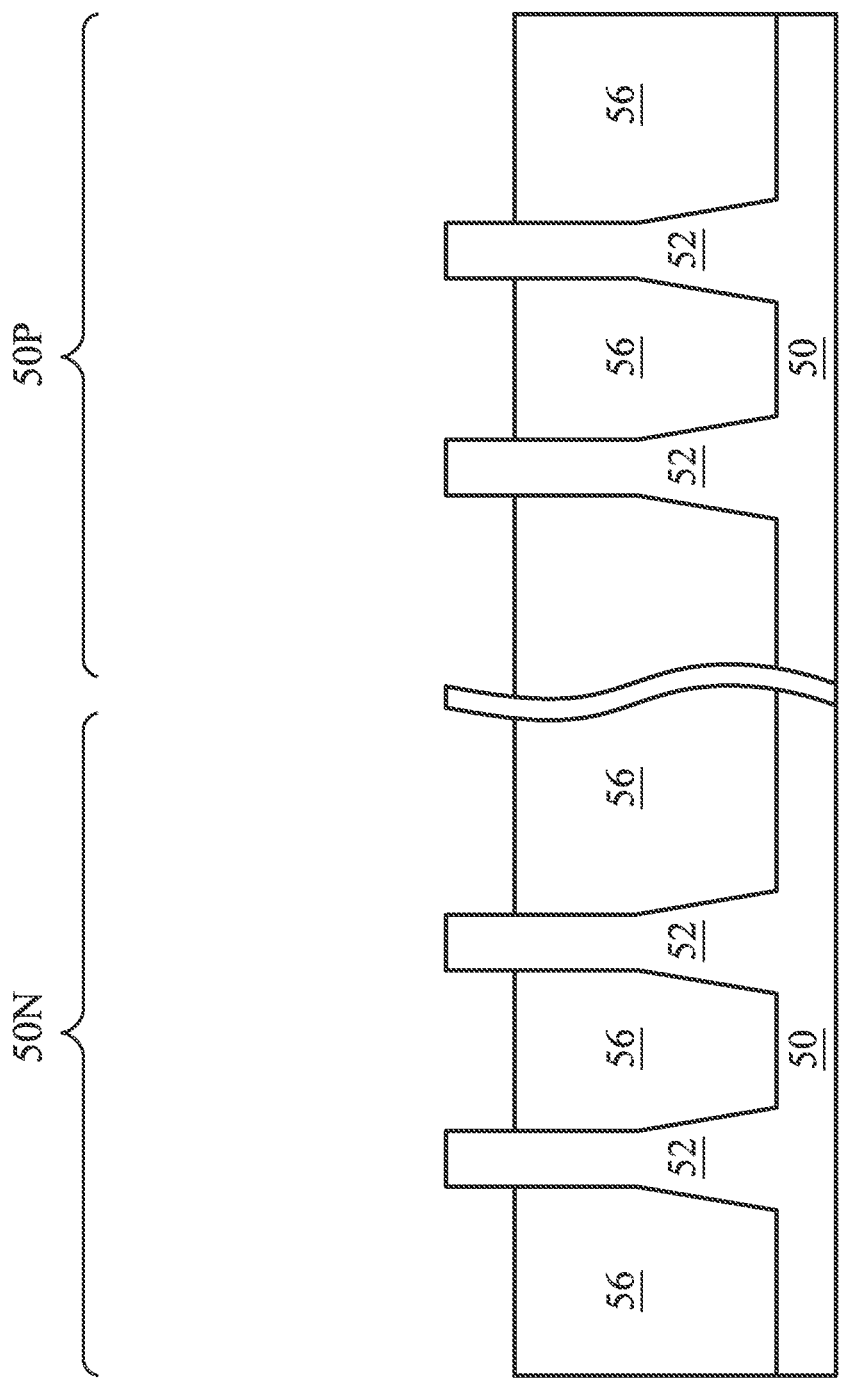

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
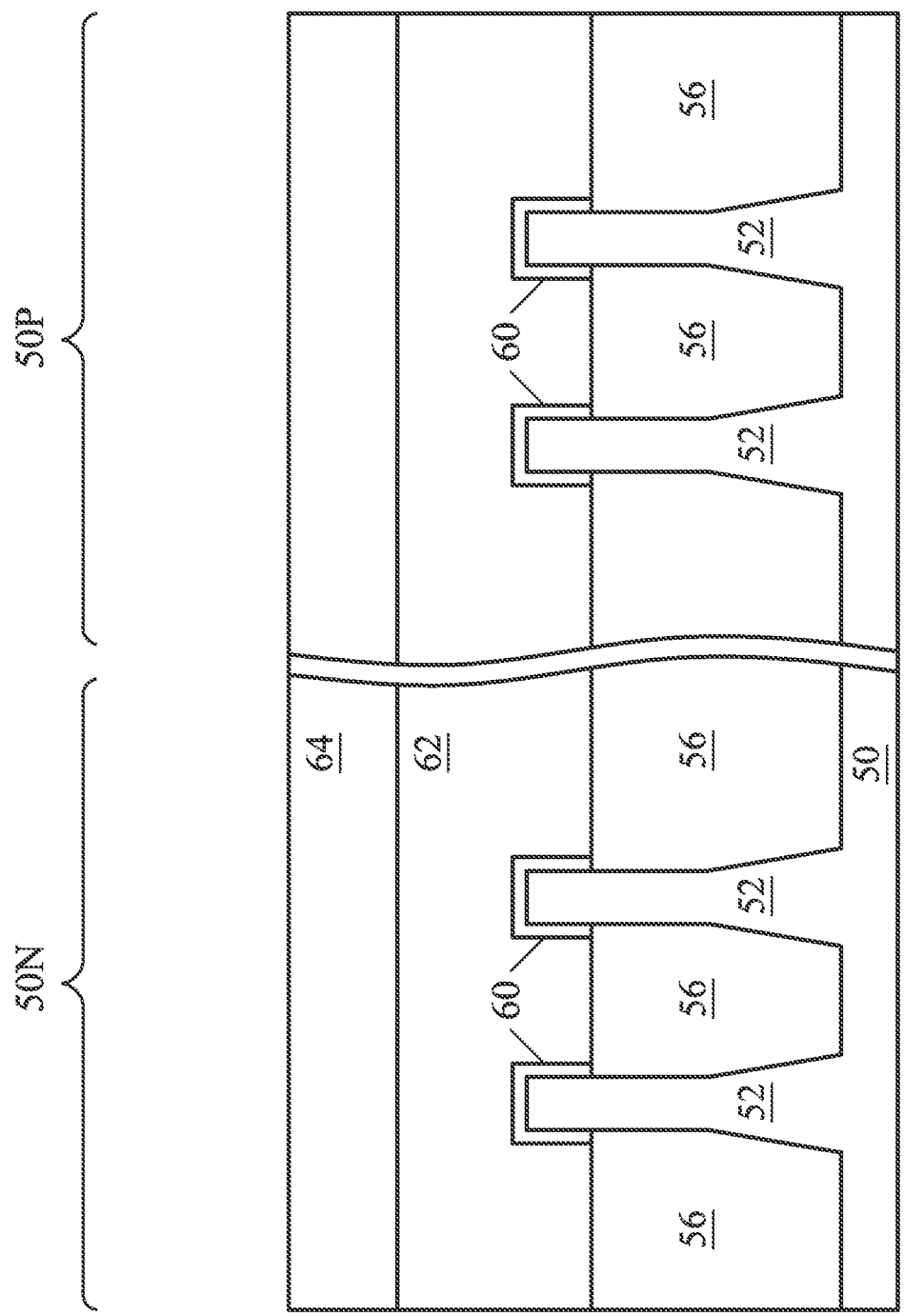

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 18B illustrate various additional steps in the manufacturing of embodiment devices. FIGS. 8A through 18B illustrate features in either of the region 50N and the region 50P. For example, the structures illustrated in FIGS. 8A through 18B may be applicable to both the region 50N and the region 50P. Differences (if any) in the structures of the region 50N and the region 50P are described in the text accompanying each figure. FIGS. 8A, 9A, 10A, 11A, 13A, 14A, 15A, 16A, 17A, and 18A are illustrated along reference cross-section A-A illustrated in FIG. 1. FIGS. 8B, 9B, 10B, 11B, 13B, 14B, 15B, 16B, 17B, and 18B are illustrated along reference cross-section B-B illustrated in FIG. 1. FIGS. 8C, 9C, 10C, 11C, and 12 are illustrated along reference cross-section C-C illustrated in FIG. 1. For clarity, some dimensions or proportions of the features shown in the FIGS. 8C through 12 may be different than as shown in other Figures.

Figure 8B:
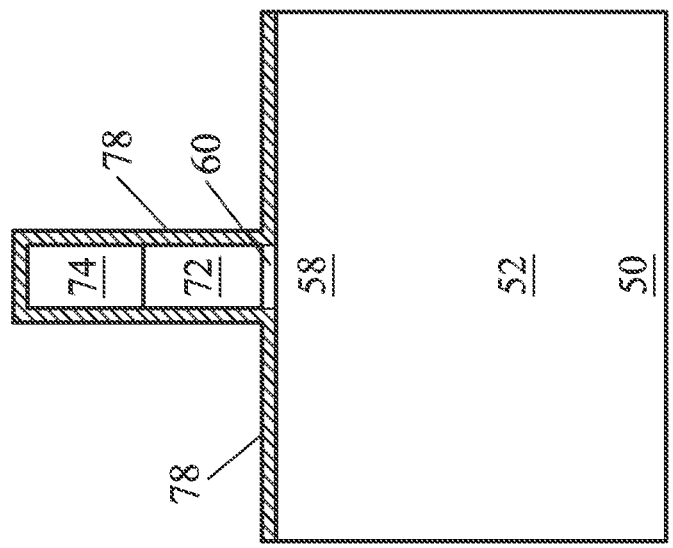
Figure 8A:
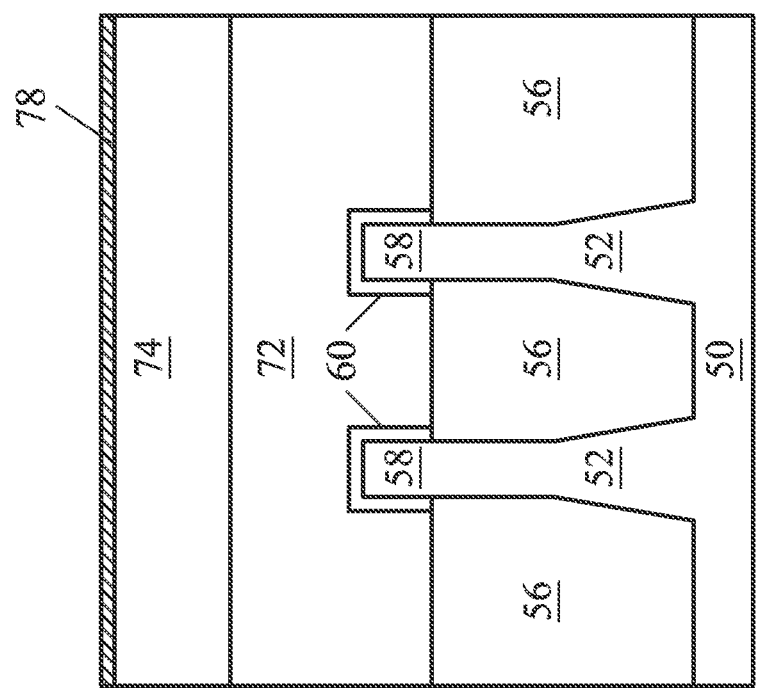

In FIGS. 8A, 8B, and 8C, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A-8C, first spacer material 78 is formed on exposed surfaces of the dummy gates 72, the masks 74, and/or the fins 52. The first spacer material 78 is used to form first spacers 80 (see FIGS. 10B-C). In some embodiments, the first spacer material 78 may be a material such as oxide, a nitride, a material such as silicon oxynitride, silicon oxycarbonitride, silicon oxycarbide, the like, or a combination thereof. In some embodiments, the first spacer material 78 may be formed using a process such as thermal oxidation, CVD, PE-CVD, ALD, PVD, sputtering, or the like. In FIG. 8B, the first spacer material 78 is shown as extending vertically over the dummy gate 72 and mask 74 and laterally over the fin 52. In some embodiments, the first spacer material 78 may include multiple layers of one or more materials. In some embodiments, the first spacer material 78 may be formed having a thickness between about 2 nm and about 6 nm.

After the formation of the first spacer material 78, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
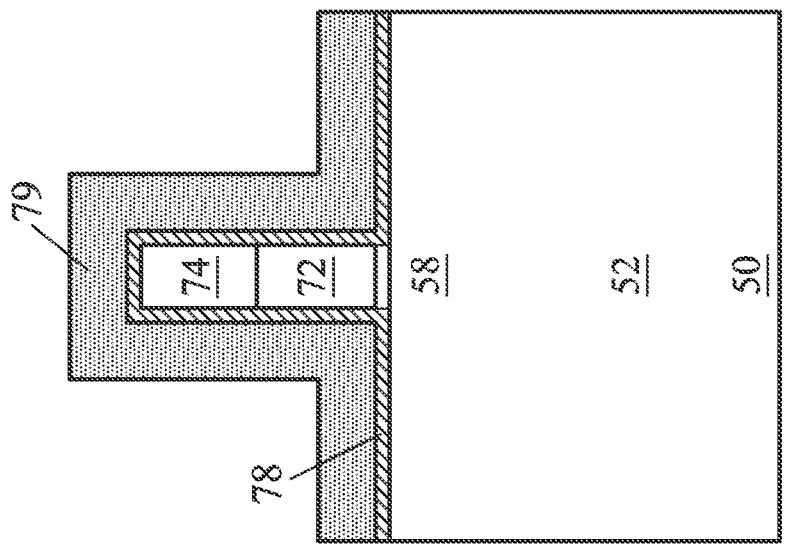
Figure 9A:
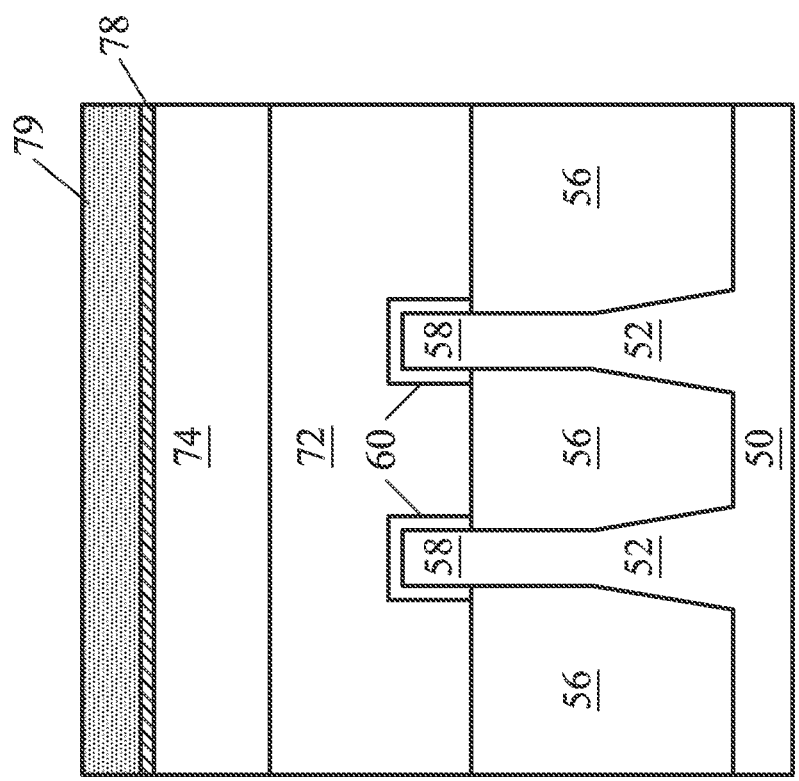
Figure 9C:
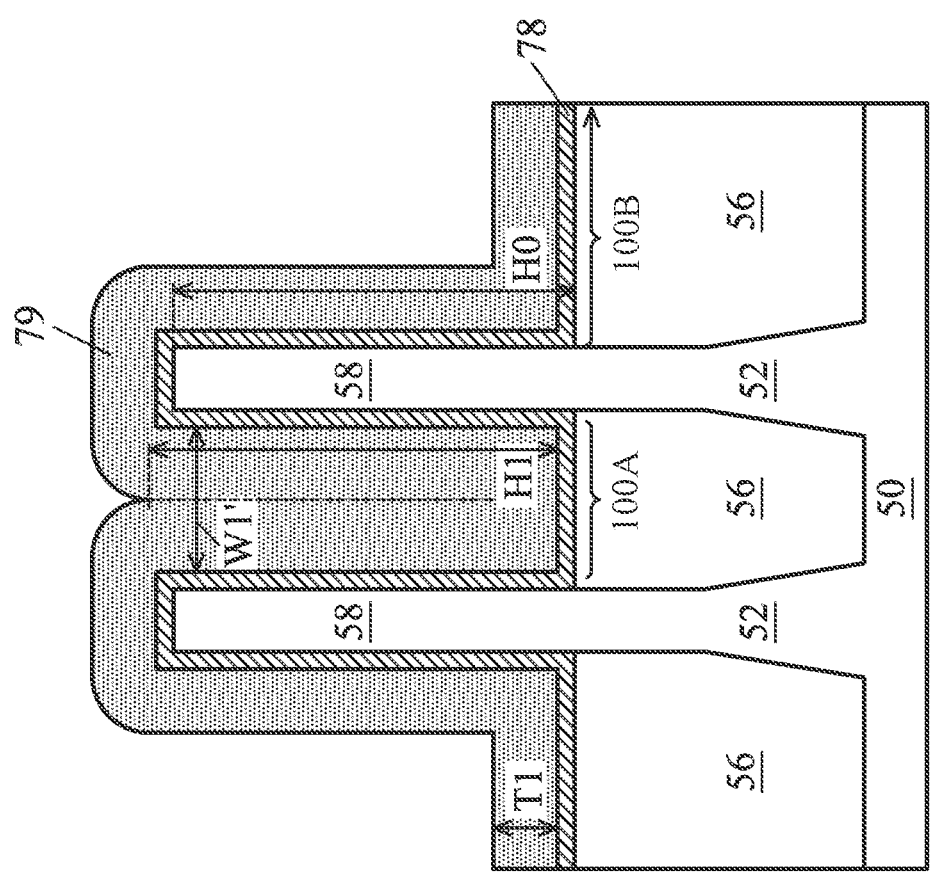

In FIGS. 9A, 9B, and 9C, second spacer material 79 is formed on the first spacer material 78. The second spacer material 79 is used to form second spacers 86 (see FIGS. 10B-C). In some embodiments, the second spacer material 79 may be a material such an oxide, a nitride, a material such as silicon oxynitride, silicon oxycarbonitride, silicon oxycarbide, the like, or a combination thereof. The second spacer material 79 may be deposited conformally using a process such as CVD, PE-CVD, ALD, PVD, sputtering, or the like. In some embodiments, the second spacer material 79 may include multiple layers of one or more materials.

In some embodiments, the second spacer material 79 is formed over the fins 52 such that regions between adjacent fins 52 (e.g., "inner" regions 100A) are at least partially filled with the second spacer material 79. The inner regions 100A may be completely filled with the second spacer material 79, as shown in FIG. 9C. As such, the second spacer material 79 may be deposited to a thickness T1 that is about equal to half of the separation distance W1' between the first spacer material 78 on adjacent fins 52 or that is greater than half of the separation distance W1'. In other embodiments, the second spacer material 79 may be deposited to a thickness T1 on the fins 52 that is less than half of the separation distance W1'. In some embodiments, the second spacer material 79 may be formed having a deposition thickness T1 between about 3 nm and about 20 nm. In some cases, the second spacer material 79 filling the inner regions may have a seam.

The top surface of the second spacer material 79 between the fins 52 may be flat, convex, or concave, which may depend on the separation distance W1' and/or the deposition thickness T1 of the deposited second spacer material 79. For example, a larger fin separation distance W1' or a smaller deposition thickness T1 may reduce the height H1 of the second spacer material 79 within the fins 52. The height H1 may be greater than the deposition thickness T1. A height H1 of the second spacer material 79 between the fins 52 may be greater than, about the same, or less than the height H0 of the fins 52 protruding above the STI regions 56. The height H1 of the second spacer material 79 between the fins 52 may be between about 3 nm and about 60 nm. By controlling the deposition thickness T1 and/or the height H1 of the second spacer material 79, the minimum inner height IH and the height difference DH of the epitaxial source/drain regions 82 (see FIG. 11C) may be controlled.

Figure 10C:
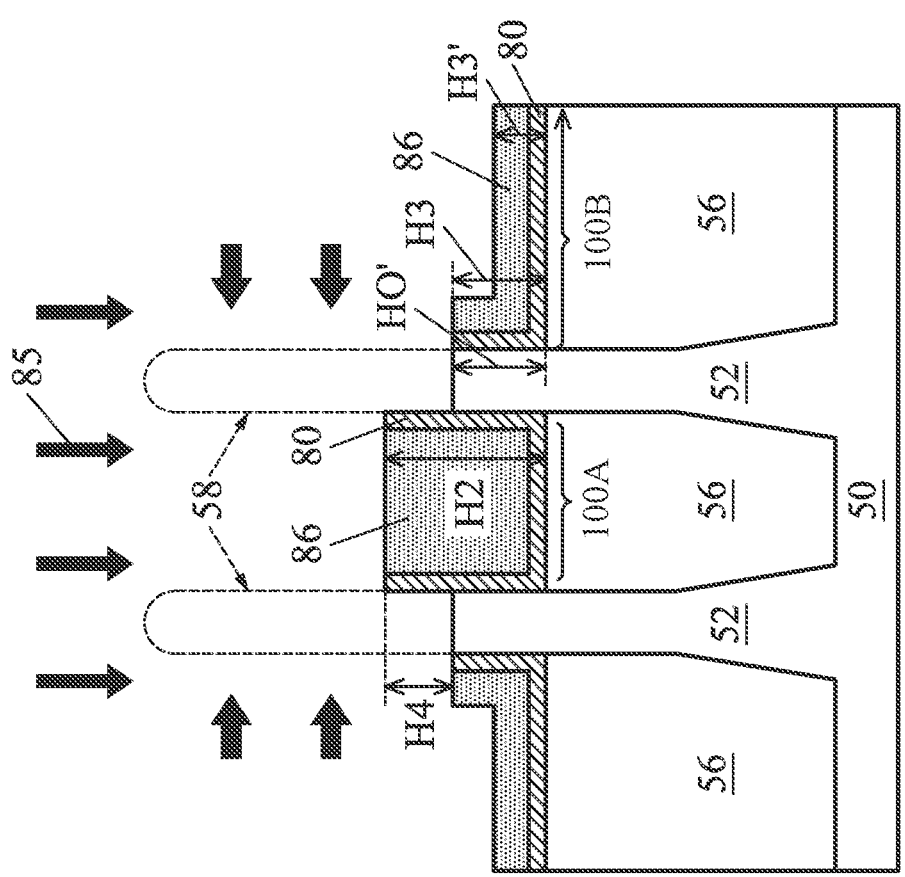

Turning to FIGS. 10A, 10B, and 10C, recesses 84 are formed in the fins 52, in accordance with some embodiments. In FIG. 10C, the location of the channel regions 58 of the fins 52 under the dummy gate structure (e.g., the channel regions 58 that are not etched to form the recesses 84) are shown for reference. The recesses 84 may be formed using an etching process 85, which also etches the first spacer material 78 to form the first spacers 80 and etches the second spacer material 79 to form second spacers 86. The first spacers 80 and the second spacers 86 may collectively be referred to herein as "gate spacers." The first spacers 80 and the second spacers 86, dummy gates 72, and masks 74 may be collectively referred to herein the "dummy gate structures." In some embodiments, the etching process 85 includes one or more etching steps, such as one or more anisotropic dry etching steps. In other embodiments, the etching process 85 includes a first etching process that etches the first spacer material 78 and the second spacer material 79 and a second etching process that forms the recesses 84. The example etching of the first spacer material 78, second spacer material 79, and recesses 84 shown in FIGS. 10B-C is intended to be illustrative, and the etching process 85 may etch the first spacer material 78, second spacer material 79, or recesses 84 differently in other embodiments. For example, surfaces of the gate spacers are shown as flat in FIG. 10C, but may be convex or concave in other embodiments.

In some embodiments, the etching process 85 may etch portions of the first spacer material 78 or second spacer material 79 different amounts such that different regions of the gate spacers (e.g., of the first spacers 80 and/or second spacers 86) extend higher above the STI regions 56 than other regions of the gate spacers. For example, after the etching process 85, regions of the gate spacers extending between adjacent fins 52 may have a greater height above the STI regions 56 than regions that are not between adjacent fins 52. This is shown in FIG. 10C, in which the "inner regions" 100A of the gate spacers (e.g., regions between fins 52) have a height H2 adjacent the fins 52, and "outer regions" 100B of the gate spacers (e.g., regions not between fins 52) have a height H3 adjacent the fins 52 that is less than the height H2. In some cases, portions of the gate spacers that are farther from the fins 52 may have a height H3' that is less than the height H3. In this manner, the gate spacers have a greater vertical thickness (e.g., the vertical distance between a bottom surface and a top surface of the gate spacers) within the inner regions 100A than within the outer regions 100B. In some embodiments, the height H2 above the STI regions 56 of the gate spacers in the inner regions 100A may be between about 5 nm and about 40 nm, and the height H3 (or H3') above the STI regions 56 of the gate spacers in the outer regions 100B may be between about 0 nm and about 30 nm. The height difference H4 between heights H2 and H3 may be between about 0 nm and about 40 nm. The height H3 may be greater than, less than, or about the same as the height H0' of the etched fins 52 protruding from the STI regions 56, and the height H2 may be greater than or about the same as the height H0'.

The height H2 of the inner regions 100A of the gate spacers may be larger than the height H3 of the outer regions 100B of the gate spacers due to the second spacer material 79 filling (or partially filling) the inner regions 100A between adjacent fins 52, as shown in FIG. 9C. The second spacer material 79 deposited within the inner regions 100A has exposed top surfaces, and the outer sidewalls of the fins 52 has both exposed top surfaces and exposed side surfaces. Thus, the etching process 85 etches the first spacer material 78 and the second spacer material 79 in the outer regions 100B at a greater overall rate than the inner regions 100A. This can result the inner regions 100A having more remaining gate spacer material after the etching process than the outer regions 100B. Additionally, the confining presence of the adjacent fins 52 can reduce etchant mobility in the inner regions 100A, further reducing the etching rate of the inner regions 100A.

In this manner, the height H2, the height H3, and/or the height difference H4 of the gate spacers may be controlled by controlling the geometry or topology of the structure, such as by controlling the separation distance W1' between adjacent fins 52, the thickness of the first spacer material 78 or the second spacer material 79, the height H1 of the second spacer material 79 in the inner regions 100A, or the like. The heights may also be controlled by controlling the process parameters of the etching process 85. The process parameters may include, for example, a process gas mixture, a voltage bias, an RF power, a process temperature, a process pressure, other parameters, or a combination thereof. In some embodiments, the shape, volume, area, size, merge height, or other characteristics of the epitaxial source/drain regions 82 (see FIGS. 11B-C) formed in the recesses 84 may be controlled by controlling the etching process 85 in this manner.

Figure 11B:
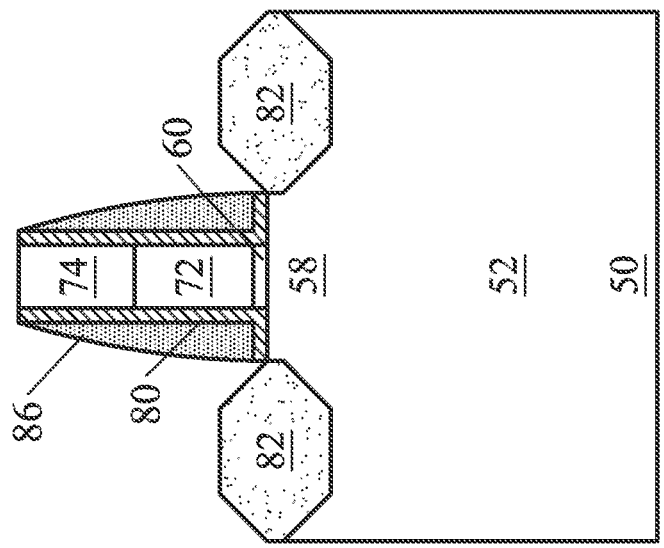
Figure 11A:
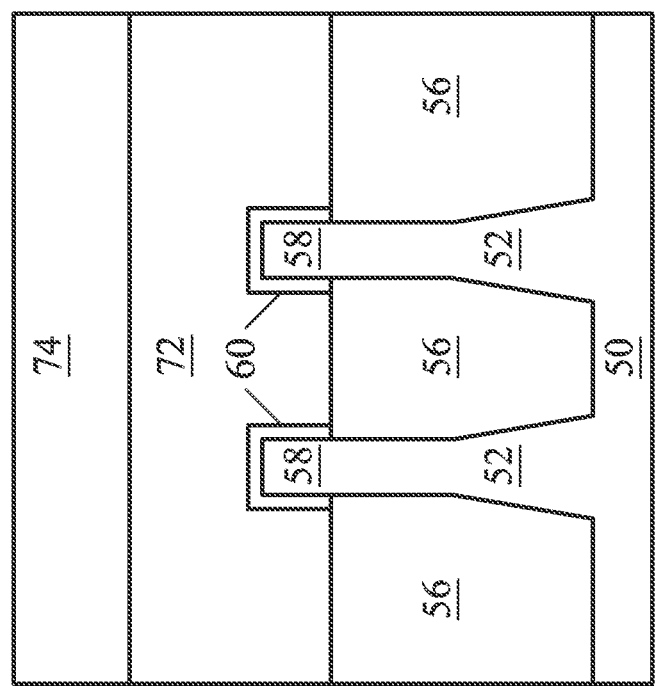
Figure 11C:
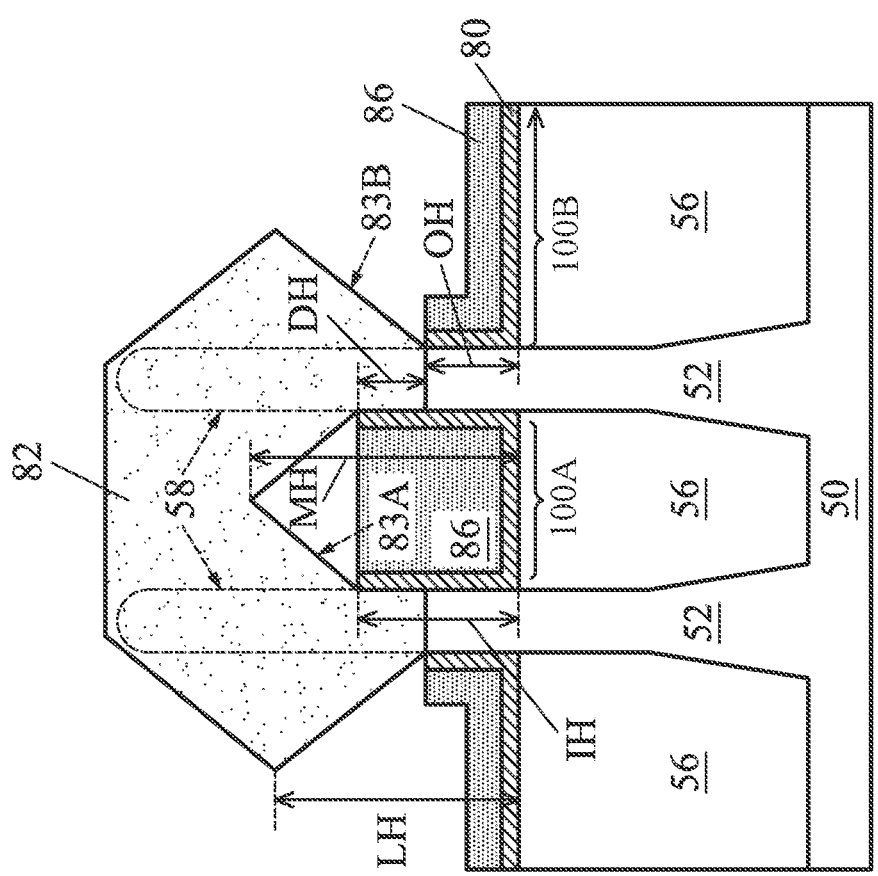

FIGS. 11A, 11B, and 11C illustrate forming epitaxial source/drain regions 82 in the fins 52, in accordance with some embodiments. For clarity, some dimensions or proportions of the features shown in the FIGS. 11A-C may be different than as shown in other Figures. The epitaxial source/drain regions 82 in the region 50N, e.g., the NMOS region, may be formed by masking the region 50P, e.g., the PMOS region, and etching source/drain regions of the fins 52 in the region 50N to form recesses 84 in the fins 52. Then, the epitaxial source/drain regions 82 in the region 50N are epitaxially grown in the recesses 84 from exposed portions of the fins 52. The epitaxial source/drain regions 82 in the region 50P, e.g., the PMOS region, may be formed by masking the region 50N, e.g., the NMOS region, and etching source/drain regions of the fins 52 in the region 50P to form recesses 84 in the fins 52. Then, the epitaxial source/drain regions 82 in the region 50P are epitaxially grown in the recesses 84 from exposed portions of the fins 52. The epitaxial source/drain regions 82 may be epitaxially grown using a suitable process such as CVD, metal-organic CVD (MOCVD), molecular beam epitaxy (MBE), liquid phase epitaxy (LPE), vapor phase epitaxy (VPE), selective epitaxial growth (SEG), the like, or a combination thereof.

The epitaxial source/drain regions 82 may include any acceptable material, such as appropriate for n-type FinFETs or p-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. If the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like.

The epitaxial source/drain regions 82 may have surfaces raised from respective surfaces of the fins 52 and may have facets. For example, the surfaces of the epitaxial source/drain regions 82 may have facets having a (111) crystalline orientation, facets of other crystalline orientations, or combinations of differently oriented facets. As illustrated in FIG. 11C, the epitaxial material formed in the adjacent fins 52 may expand laterally outward beyond sidewalls of the fins 52 along crystalline planes and merge in the inner regions 100A to form a continuous epitaxial source/drain region 82 extending over multiple adjacent fins 52. For example, the epitaxial material grown from adjacent fins 52 may merge in the inner regions 100A at a merge height MH above the STI regions 56. In this manner, the epitaxial source/drain regions 82 may have a bottom inner surface 83A extending between adjacent fins 52 within the inner regions 100A and a bottom outer surface 83B extending from the fins 52 into the outer regions 100B. In some cases, the surfaces 83A and 83B may be faceted, such as having {111} facets or other facets.

In some embodiments, lateral growth of the epitaxial material is blocked by the material of the gate spacers. For example, lateral growth in the inner regions 100A may be blocked below the height H2 of the gate spacers in the inner regions 100A, and lateral growth in the outer regions 100B may be blocked below the height H3 of the gate spacers in the outer regions 100B. In this manner, the bottom inner surface 83A of the epitaxial source/drain regions 82 extending into the inner regions 100A may have a minimum inner height IH above the STI regions 56 that is about the same as the height H2 of the gate spacers in the inner regions 100A. Additionally, the bottom outer surface 83B of the epitaxial source/drain regions 82 extending into the outer regions 100B may have a minimum outer height OH above the STI regions 56 that is about the same as the height H3 of the gate spacers in the outer regions 100B. Due to the height difference H4 of the gate spacers described above, the height IH may be greater than the height OH. In some embodiments, the minimum inner height IH may be between about 5 nm and about 40 nm, and the minimum outer height OH may be between about 0 nm and about 30 nm. The height difference DH between heights IH and OH may be between about 5 nm and about 40 nm.

In some embodiments, the merge height MH of the epitaxial source/drain region 82 may be controlled by controlling the minimum inner height IH of the epitaxial source/drain region 82, which may be controlled by controlling the height H2 of the gate spacers in the inner regions 100A. The height H2 of the gate spacers may be controlled as described previously. In some embodiments, the merge height MH may be between about 5 nm and about 70 nm. The merge height MH may be controlled to be above, below, or about level with the lateral height LH of the epitaxial source/drain regions 82, which designates the height above the STI regions 56 of the portion of the epitaxial source/drain regions 82 that laterally extends farthest into an outer region 100B. In some embodiments, the lateral height LH may be between about 30 nm and about 50 nm. In some embodiments, the merge height MH may be controlled to be above, below, or about level with the mid-height (e.g., the height at half the full vertical thickness) of the epitaxial source/drain region 82, which in some cases may be about the same as the lateral height LH.

By controlling the merge height MH, the cross-sectional area of the epitaxial source/drain regions 82 may be controlled. For example, a greater MH can correspond to a smaller cross-sectional area of the epitaxial source/drain regions 82. Additionally, the cross-sectional area of the epitaxial source/drain regions 82 may be controlled by controlling the height difference DH. For example, a greater DH can correspond to a smaller cross-sectional area of the epitaxial source/drain regions 82. By reducing the cross-sectional area of the epitaxial source/drain regions 82, the parasitic gate-to-drain capacitance (Cgd) of a FinFET device may be reduced, which can improve performance of the FinFET device. For example, RC delay of the FinFET device may be reduced and the response speed of the FinFET device may be improved. In this manner, increasing the height difference DH can reduce the parasitic capacitance Cgd. In some embodiments, the cross-sectional area of an epitaxial source/drain region 82 with a nonzero DH may be reduced to between about 0% and about 28% of the cross-sectional area of a reference epitaxial source/drain region in which DH=0.

Figure 12:
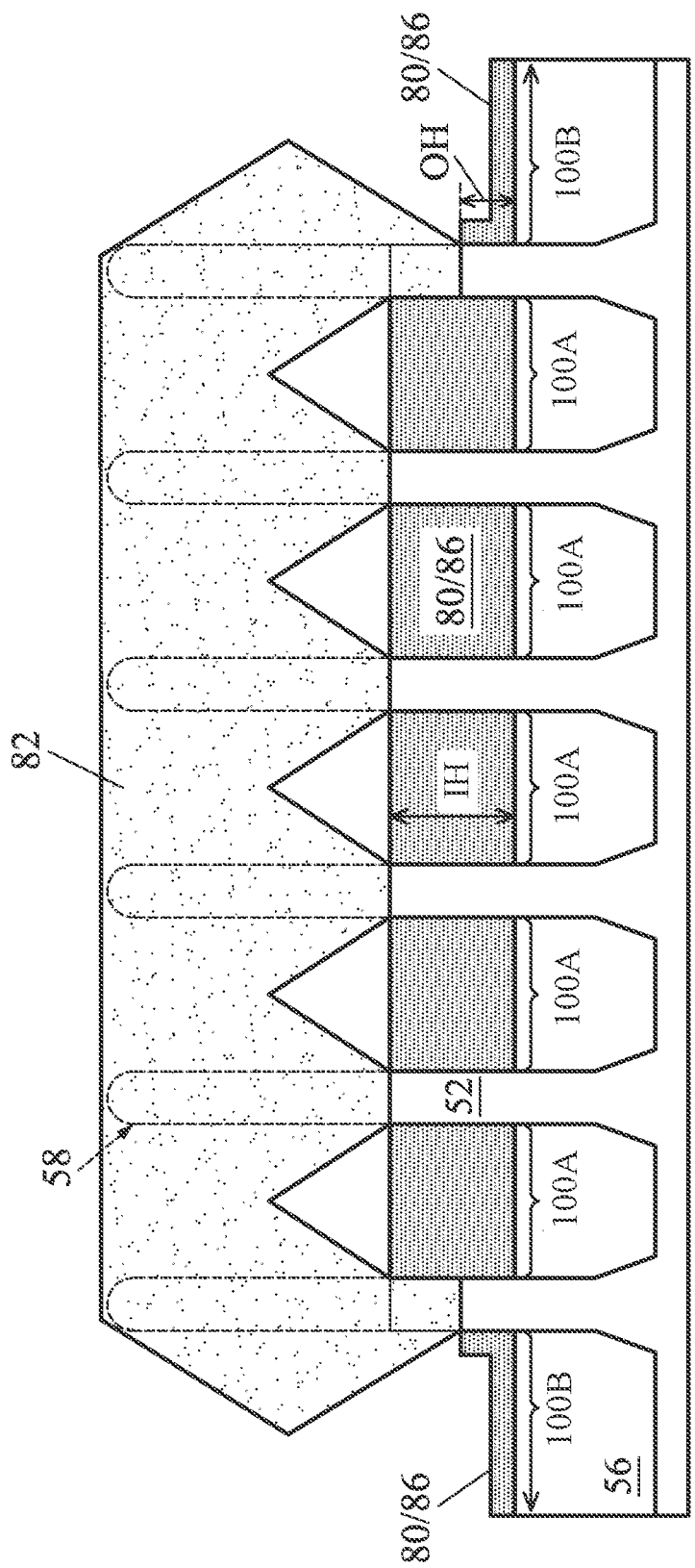

In some embodiments, an epitaxial source/drain region 82 may be formed from merged epitaxial material grown in more than two fins 52. An example multi-fin embodiment is shown in FIG. 12, though an epitaxial source/drain region 82 may be formed over more or fewer fins 52 than shown. As shown in FIG. 12, the region between each pair of adjacent fins 52 is an "inner" region. The techniques described herein may be used to reduce the cross-sectional area of the epitaxial source/drain regions 82 in this and other multi-fin embodiments.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth. In some embodiments, a profile of the epitaxial source/drain regions 82 is a prism array facing the substrate 50, which may include shorter prisms sandwiched between higher prisms.

Figure 13B:
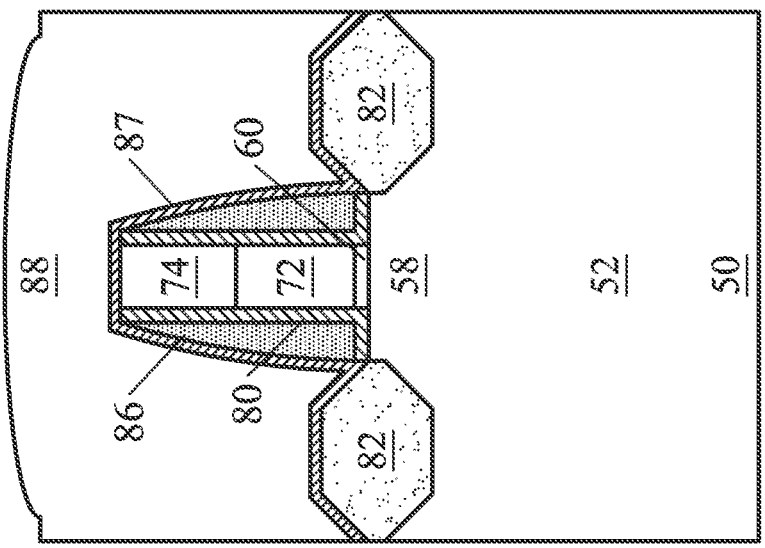
Figure 13A:
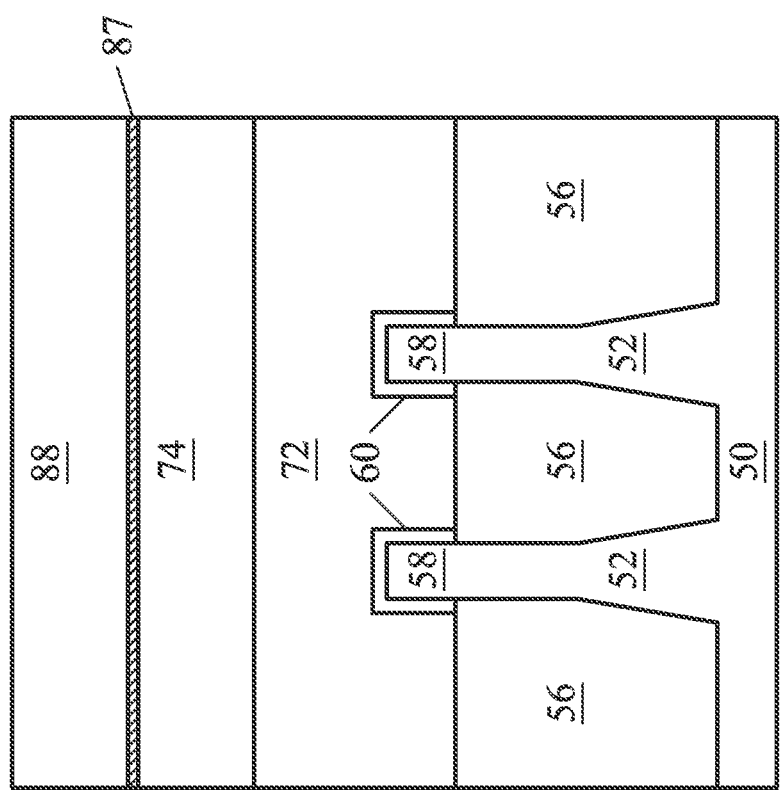

In FIGS. 13A and 13B, a first interlayer dielectric (ILD) 88 is deposited over the structure. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers. The CESL 87 may comprise a dielectric material, such as, silicon nitride, silicon oxide, silicon oxynitride, or the like, having a different etch rate than the material of the overlying first ILD 88.

Figure 14B:
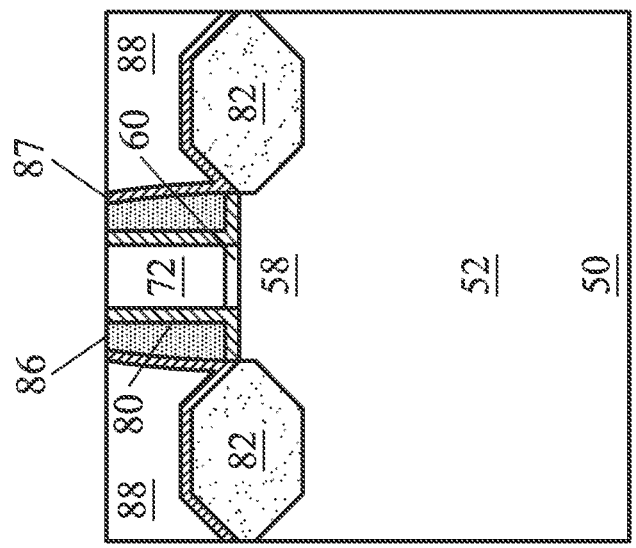
Figure 14A:
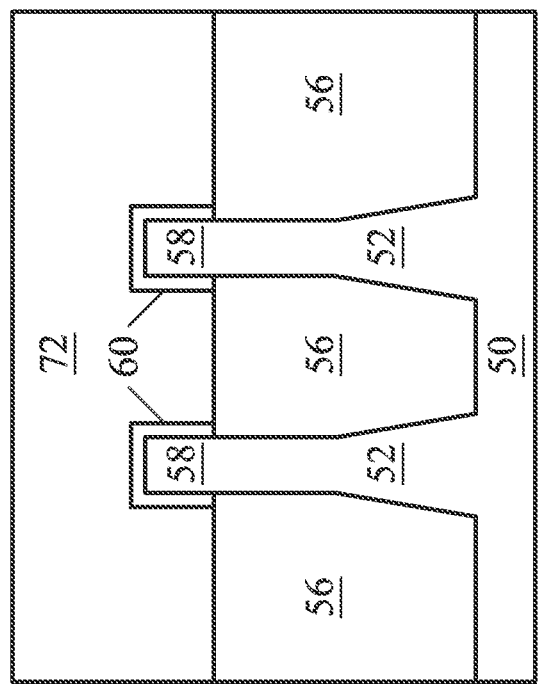

In FIGS. 14A and 14B, a planarization process, such as a CMP, may be performed to level the top surface of the first ILD 88 with the top surfaces of the dummy gates 72 or the masks 74. The planarization process may also remove the masks 74 on the dummy gates 72, and portions of the first spacers 80 and the second spacers 86 along sidewalls of the masks 74. After the planarization process, top surfaces of the dummy gates 72, the first spacers 80, the second spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 15B:
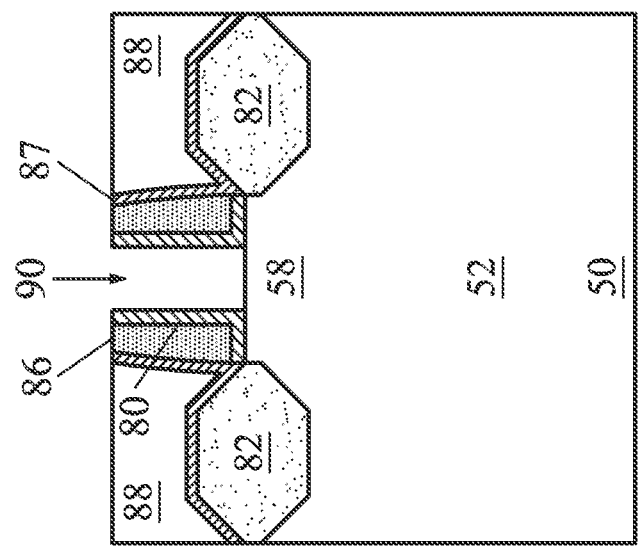
Figure 15A:
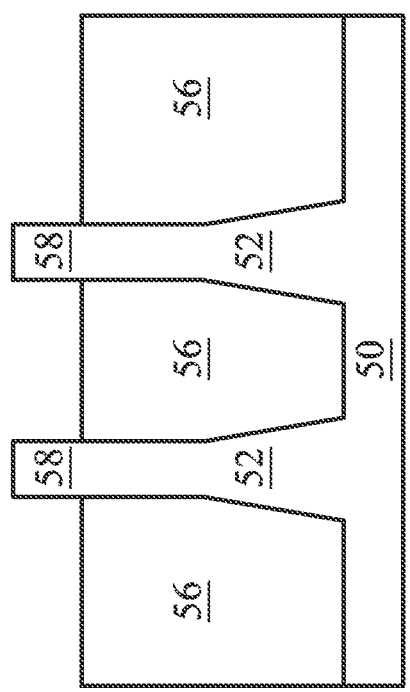

In FIGS. 15A and 15B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 16B:
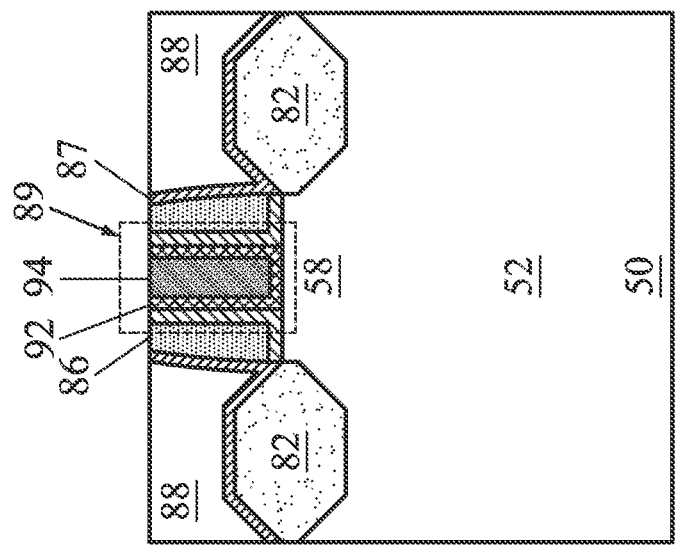
Figure 16A:
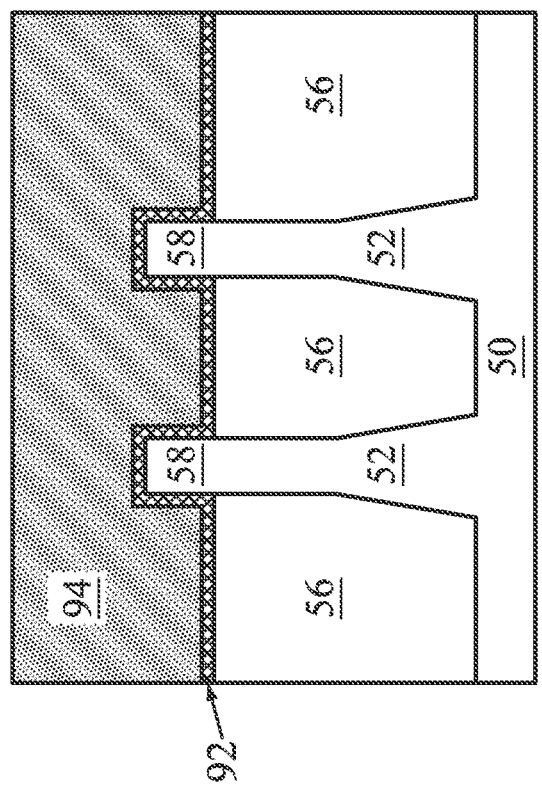
Figure 16C:
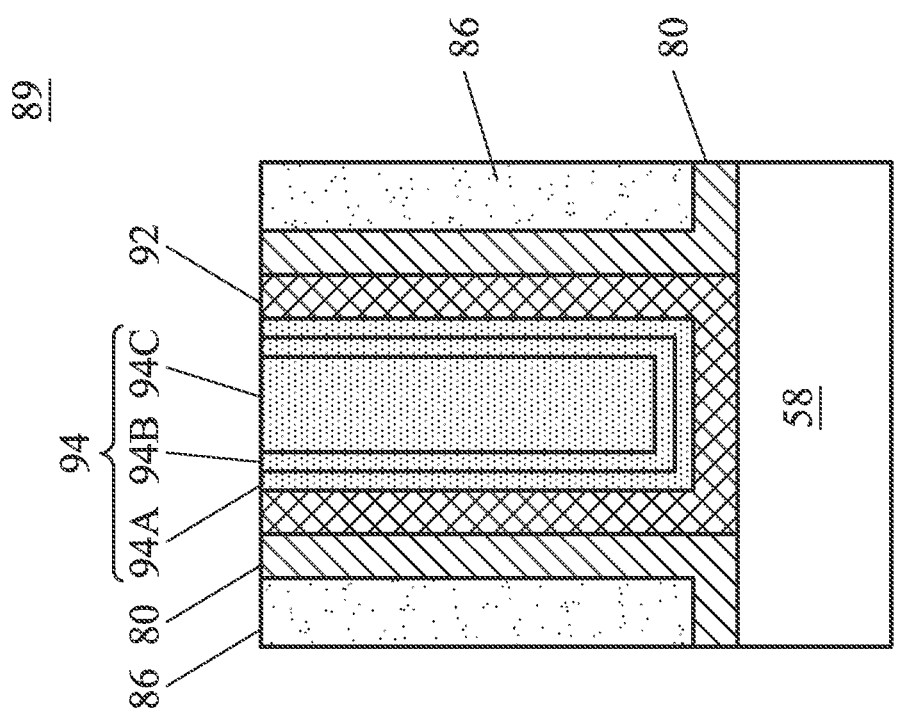

In FIGS. 16A and 16B, gate dielectric layers 92 and gate electrodes 94 are formed for replacement gates. FIG. 16C illustrates a detailed view of region 89 of FIG. 16B. Gate dielectric layers 92 are deposited conformally in the recesses 90, such as on the top surfaces and the sidewalls of the fins 52 and on sidewalls of the gate spacers. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 16B, the gate electrode 94 may comprise any number of liner layers 94A, any number of work function tuning layers 94B, and a fill material 94C as illustrated by FIG. 16C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 17B:
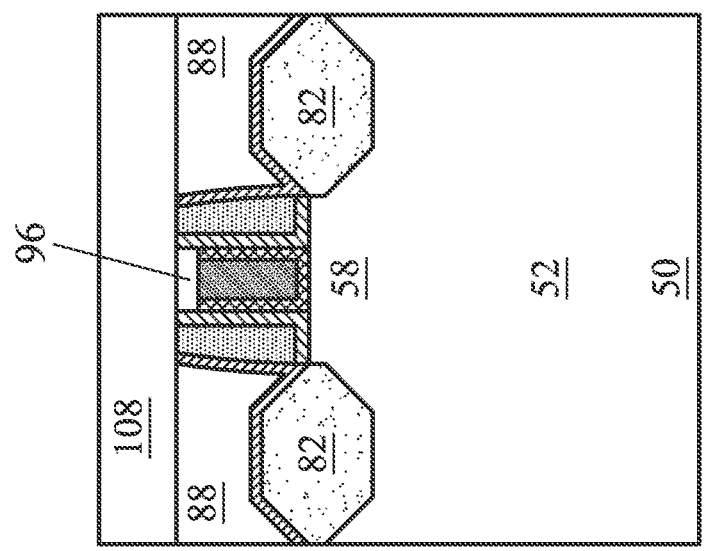
Figure 17A:
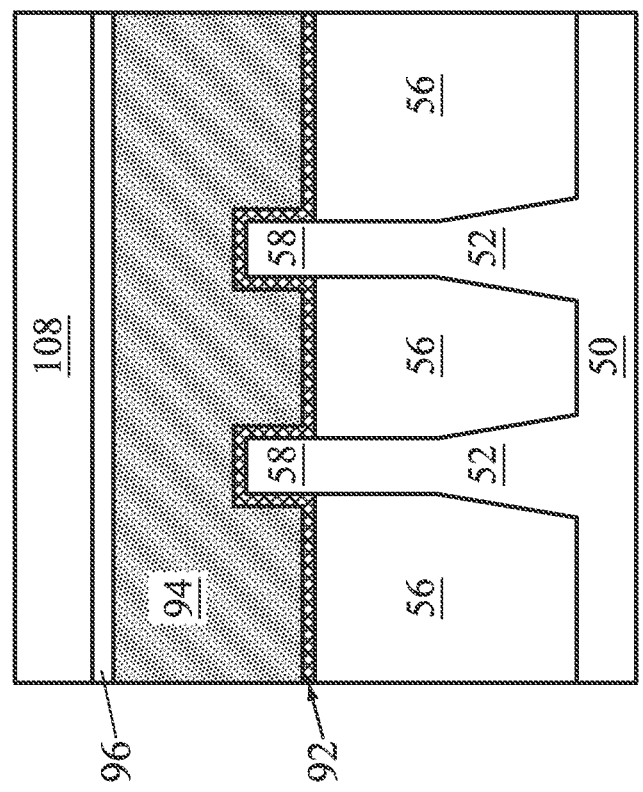

In FIGS. 17A and 17B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of second spacers 86, as illustrated in FIGS. 17A and 17B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (see FIGS. 18A-B) penetrate through the gate mask 96 to contact the top surface of the recessed gate electrode 94.

Figure 18B:
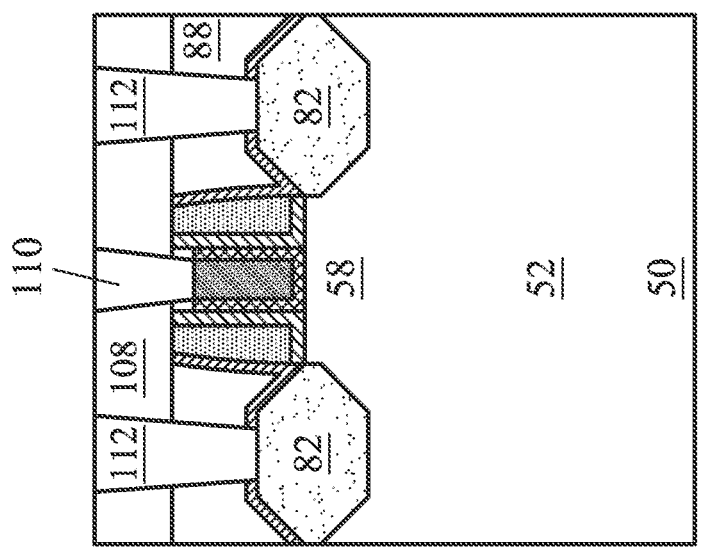
Figure 18A:
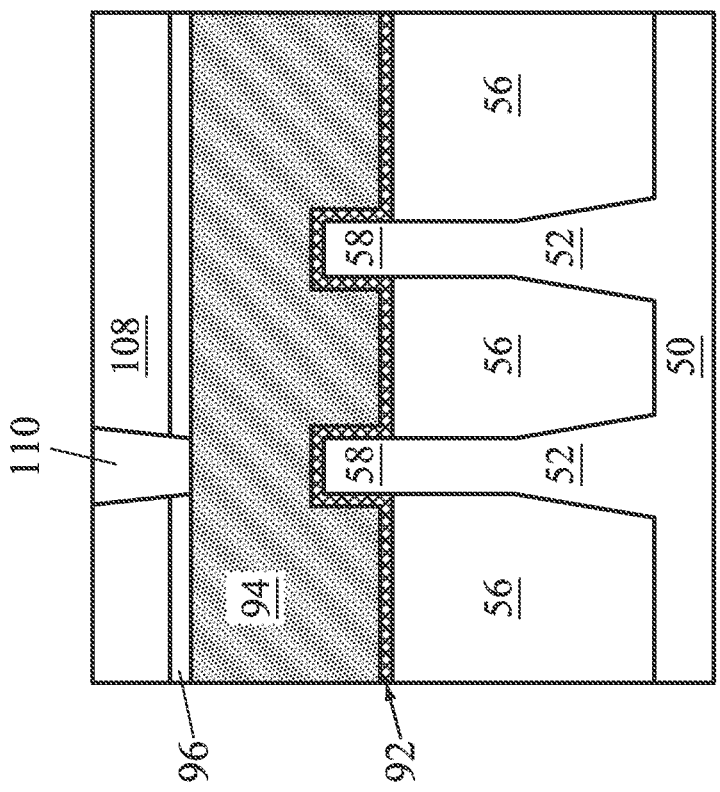

In FIGS. 18A and 18B, gate contacts 110 and source/drain contacts 112 are formed through the second ILD 108 and the first ILD 88, in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are formed by patterning a stack of alternating layers of channel layers and sacrificial layers. The dummy gate stacks and epitaxial source/drain regions are formed in a similar manner as described above. After the dummy gate stacks are removed, the sacrificial layers can be partially or fully removed in the channel regions. The replacement gate structures are formed in a similar manner as described above and will partially or completely surround the channel layers in the channel region of the NSFET devices. The ILDs and contacts to the gate structures and source/drains are formed in a similar manner as described above. A nanostructure device can be formed as disclosed in U.S. Patent Application Publication 2016/0365414, which is incorporated herein by reference in its entirety.

The embodiments described herein may achieve advantages. The techniques described herein describe the formation of epitaxial source/drain regions having reduced volume and reduced cross-sectional area. For example, using the techniques described herein, the epitaxial material formed on adjacent fins may merge at a higher point, which reduces the overall cross-sectional area of the merged epitaxial source/drain region. The merge height and the cross-sectional area may be controlled according to the desired application by controlling the amount of a gate spacer material deposited between adjacent fins and by controlling the parameters of the etching process that forms gate spacers from the gate spacer material. By reducing the cross-sectional area of the epitaxial source/drain region, parasitic capacitances (e.g., gate-to-drain capacitance (Cgd)) may be reduced, which can reduce RC delay, and allow for faster on/off switching and boosted device speed, such as the speed of a ring-oscillator (RO) device.

In accordance with some embodiments, a device includes a first fin and a second fin extending from a substrate, the first fin including a first recess and the second fin including a second recess; an isolation region surrounding the first fin and surrounding the second fin; a gate stack over the first fin and the second fin; a spacer material over the isolation region and surrounding the first fin and the second fin, wherein a first portion of the spacer material that extends from a first side of the first fin to the second fin has a first vertical thickness, wherein a second portion of the spacer material adjacent a second side of the first fin opposite the first side has a second vertical thickness that is less than the first vertical thickness; and a source/drain region in the first recess and in the second recess, the source/drain region adjacent the gate stack, wherein the source/drain region includes a first bottom surface extending over the first portion of the spacer material and a second bottom surface extending over the second portion of the spacer material, wherein a bottom of the second bottom surface is closer to the isolation region than a bottom of the first bottom surface. In an embodiment, the first bottom surface and the second bottom surface are faceted. In an embodiment, a top of the first bottom surface is farther from the isolation region than a top of the second bottom surface. In an embodiment, the top of the first bottom surface is in the range between 5 nm and 70 nm from the isolation region. In an embodiment, the difference between the first vertical thickness and the second vertical thickness is in the range between 5 nm and 40 nm. In an embodiment, the source/drain region extends on a sidewall of the first portion of the spacer material. In an embodiment, a sidewall of the second portion of the spacer material that is adjacent the second side of the first fin is free of the source/drain region. In an embodiment, the spacer material includes a first layer of a first dielectric material and a second layer of a second dielectric material. In an embodiment, the first portion of the spacer material protrudes above a bottom surface of the first recess and a bottom surface of the second recess.

In accordance with some embodiments, a structure includes a first fin over a semiconductor substrate; a second fin over the semiconductor substrate, the second fin being adjacent the first fin; an isolation region surrounding the first fin and the second fin; a gate spacer material over the isolation region, wherein the gate spacer material between a first side of the first fin and a first side of the second fin extends farther above the isolation region than the gate spacer material on a second side of the first fin that is opposite the first side of the first fin, wherein the first side of the first fin and the first side of the second fin are facing each other; a gate structure along sidewalls and over upper surfaces of the first fin and the second fin; and a source/drain region on the first fin and the second fin adjacent the gate structure, the source/drain region including a downward-facing first facet on the first side of the first fin and a downward-facing second facet on the second side of the first fin, wherein a first portion of the source/drain region on the first side of the first fin extends on a sidewall of the gate spacer material and a second portion of the source/drain region on the second side of the first fin extends over a top surface of the gate spacer material, wherein the first portion and the second portion are the same height above the isolation region. In an embodiment, a bottom of the first facet is farther above the isolation region than a bottom of the second facet. In an embodiment, a top of the first facet is farther above the isolation region than a top of the second facet. In an embodiment, the second distance is zero. In an embodiment, a top surface of the source/drain region is flat. In an embodiment, the first facet and the second facet have a (111) crystalline orientation. In an embodiment, the structure includes a downward-facing third facet on the first side of the second fin, wherein the third facet terminates at the first facet.

In accordance with some embodiments, a method includes forming fins protruding from a semiconductor substrate; forming a gate structure over the fins; forming an isolation region surrounding the fins; depositing a spacer layer over the gate structure and over the fins, wherein the spacer layer fills the regions extending between pairs of adjacent fins; performing a first etching process on the spacer layer, wherein after performing the first etching process, first remaining portions of the spacer layer that are within inner regions extending between pairs of adjacent fins have a first thickness and second remaining portions of the spacer layer that are not within the inner regions have a second thickness that is less than the first thickness; and forming an epitaxial source/drain region adjacent the gate structure and extending over the fins, wherein portions of the epitaxial source/drain region within the inner regions are separated from the first remaining portions of the spacer layer. In an embodiment, the method includes forming a second etching process on the fins to form a recess within each respective fin. In an embodiment, the epitaxial source/drain region has a bottom surface that is closer to the isolation region than the second remaining portions of the spacer layer. In an embodiment, depositing the spacer layer includes depositing a first dielectric layer and then conformally depositing a second dielectric layer on the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field-effect transistor (FinFET) device, comprising:
 a first fin over a substrate, the first fin comprising a first inner sidewall and a first outer sidewall;
 a second fin over the substrate, the second fin being adjacent the first fin, the first inner sidewall of the first fin facing a second inner sidewall of the second fin;
 a dielectric structure over the substrate and adjacent the first fin and the second fin; and
 a source/drain region on the first fin and the second fin, the source/drain region comprising a semiconductor material different than a material of the first fin and the second fin, the semiconductor material comprising:
  a third inner sidewall extending from the first inner sidewall, the third inner sidewall extending higher than an upper surface of the first fin;
  a first downward-facing facet extending from the third inner sidewall; and
  a second downward-facing facet extending from the first outer sidewall of the first fin, wherein a lowest point of the second downward-facing facet is lower than a lowest point of the first downward-facing facet in a cross-sectional view.

2. The FinFET device of claim 1, wherein the dielectric structure comprises:
 an isolation region surrounding the first fin and the second fin.

3. The FinFET device of claim 2, wherein the dielectric structure further comprises one or more insulating layers over the isolation region, wherein a first height of the one or more insulating layers on the first inner sidewall of the first fin is greater than a second height of the one or more insulating layers on the first outer sidewall of the first fin.

4. The FinFET device of claim 3, wherein a difference between the first height and the second height is in a range between 5 nm and 40 nm.

5. The FinFET device of claim 3, wherein the third inner sidewall contacts at least one of the one or more insulating layers.

6. The FinFET device of claim 2, wherein the isolation region has a same height on the first inner sidewall and the first outer sidewall.

7. The FinFET device of claim 2, wherein a vertical distance from a lowest point of the first downward-facing facet to an upper surface of the isolation region is in a range between 5 nm and 70 nm in the cross-sectional view.

8. A fin field-effect transistor (FinFET) device comprising:
- a first fin over a substrate, the first fin comprising a first inner sidewall and a first outer sidewall;
- a second fin over the substrate, the second fin comprising a second inner sidewall facing toward the first inner sidewall of the first fin, the second fin being adjacent the first fin; and
- a source/drain region on the first fin and the second fin, the source/drain region comprising:
  - a first downward-facing facet;
  - a third inner sidewall extending upward from the first inner sidewall of the first fin to the first downward-facing facet, wherein the first downward-facing facet and the third inner sidewall are non-perpendicular; and
  - a second downward-facing facet extending from the first outer sidewall.

9. The FinFET device of claim 8, further comprising an isolation region surrounding the first fin and the second fin, wherein the first downward-facing facet and the second downward-facing facet are spaced apart from the isolation region.

10. The FinFET device of claim 9, further comprising one or more insulating layers over the isolation region, wherein a height of the one or more insulating layers on the first inner sidewall of the first fin is greater than a height of the one or more insulating layers on the first outer sidewall of the first fin.

11. The FinFET device of claim 10, wherein a lowermost point of an upper surface of the one or more insulating layers between the first fin and the second fin is higher than an uppermost point of an upper surface of the one or more insulating layers adjacent the first outer sidewall of the first fin in a cross-sectional view.

12. The FinFET device of claim 8, wherein the second downward-facing facet extends to the second fin.

13. The FinFET device of claim 8, wherein the first downward-facing facet and the second downward-facing facet have a (111) crystal orientation.

14. A fin field-effect transistor (FinFET) device comprising:
- a first fin over a substrate, the first fin comprising a first side and a second side;
- a second fin over the substrate, the second fin being adjacent the first fin;
- a dielectric structure over the substrate and adjacent the first fin and the second fin; and
- a source/drain region on the first fin and the second fin, the source/drain region comprising:
  - a first downward-facing facet disposed above a first portion of the dielectric structure on the first side of the first fin;
  - an inner sidewall extending from the first fin to the first downward-facing facet, at least a portion of the inner sidewall being covered by a vertical sidewall of the dielectric structure; and
  - a second downward-facing facet extending from the first fin on a second side of the first fin.

15. The FinFET device of claim 14, wherein the dielectric structure comprises an isolation region and one or more insulating layers over the isolation region.

16. The FinFET device of claim 15, wherein an uppermost surface the one or more insulating layers between the first fin and the second fin is higher than an uppermost surface of the one or more insulating layers on the second side of the first fin in a cross-sectional view.

17. The FinFET device of claim 15, wherein the source/drain region extends along a sidewall of the one or more insulating layers.

18. The FinFET device of claim 15, further comprising a gate structure over the first fin, wherein the source/drain region protrudes above a top of the first fin under the gate structure.

19. The FinFET device of claim 14, wherein the inner sidewall and the first side of the first fin extend along a same sidewall of the dielectric structure.

20. The FinFET device of claim 14, wherein the inner sidewall and the first side of the first fin are colinear.

* * * * *

UNITED STATES PATENT AND TRADEMARK OFFICE
CERTIFICATE OF CORRECTION

| | | |
|---|---|---|
| PATENT NO. | : 11,804,408 B2 | |
| APPLICATION NO. | : 17/826563 | |
| DATED | : October 31, 2023 | |
| INVENTOR(S) | : Liu et al. | |

It is certified that error appears in the above-identified patent and that said Letters Patent is hereby corrected as shown below:

In the Claims

In Column 18, in Claim 16, Line 25, after "surface" insert -- of --.

Signed and Sealed this
Ninth Day of January, 2024

Katherine Kelly Vidal
*Director of the United States Patent and Trademark Office*